United States Patent
Dilocker et al.

(10) Patent No.: US 10,941,163 B2
(45) Date of Patent: Mar. 9, 2021

(54) METAL COMPOSITIONS AND METHODS OF MAKING SAME

(71) Applicant: Pryog, LLC, Attleboro, MA (US)

(72) Inventors: Stephanie Dilocker, Inverness, FL (US); Joseph J. Schwab, Hattiesburg, MS (US)

(73) Assignee: Pryog, LLC, Fall River, MA (US)

( * ) Notice: Subject to any disclaimer, the term of this patent is extended or adjusted under 35 U.S.C. 154(b) by 305 days.

(21) Appl. No.: 15/739,401

(22) PCT Filed: Sep. 29, 2015

(86) PCT No.: PCT/US2015/052875
§ 371 (c)(1),
(2) Date: Dec. 22, 2017

(87) PCT Pub. No.: WO2017/058160
PCT Pub. Date: Apr. 6, 2017

(65) Prior Publication Data
US 2018/0362551 A1    Dec. 20, 2018

(51) Int. Cl.
*C07F 7/00* (2006.01)
*H01L 21/308* (2006.01)
*H01L 21/033* (2006.01)

(52) U.S. Cl.
CPC .......... *C07F 7/003* (2013.01); *H01L 21/0332* (2013.01); *H01L 21/3081* (2013.01); *H01L 21/3086* (2013.01)

(58) Field of Classification Search
CPC ..................................................... C07F 7/003
(Continued)

(56) References Cited

U.S. PATENT DOCUMENTS 2,502,411 A    4/1950 Neher et al.
3,264,272 A    8/1966 Rees
(Continued)

FOREIGN PATENT DOCUMENTS

JP    S56147101 A    11/1981
JP    57028116 A    2/1982
(Continued)

OTHER PUBLICATIONS

"Chemometric of Liquid-Liquid Extraction of Metal Complexes, a Review," Nworier et al., Nature and Science, 2014, 12(5), p. 87-96 (Year: 2014).*
(Continued)

*Primary Examiner* — Ian A Rummel
(74) *Attorney, Agent, or Firm* — Alix, Yale & Ristas, LLP

(57) ABSTRACT

The present disclosure relates to a process for forming a refined metal-containing unit by reducing yield impurities with acidified deionized water. Another embodiment is a composition comprising the refined metal-containing unit. Yet another embodiment is a process for forming a patterned substrate by depositing a composition comprising the refined metal-containing unit on a substrate, drying the film comprising the refined metal-containing unit, exposing the film comprising the refined metal-containing composition to a source of actinic radiation, and transferring the pattern to substrate. The disclosed embodiments are useful in producing patterned substrates by direct or indirect pattern transfer from films comprising the refined metal-containing unit.

15 Claims, 3 Drawing Sheets

(58) Field of Classification Search
USPC .................................................. 428/195.1
See application file for complete search history.

(56) References Cited

U.S. PATENT DOCUMENTS

| | | | |
|---|---|---|---|
| 3,379,702 A | 4/1968 | Spivey | |
| 3,672,942 A | 6/1972 | Neumann et al. | |
| 3,705,137 A | 12/1972 | Kuwahara et al. | |
| 3,885,076 A | 5/1975 | Heidenreich et al. | |
| 4,022,960 A | 5/1977 | Mima et al. | |
| 4,129,524 A | 12/1978 | Nagai et al. | |
| 4,429,094 A | 1/1984 | Massucco | |
| 4,585,841 A | 4/1986 | Eguchi et al. | |
| 4,608,409 A | 8/1986 | Coady et al. | |
| 5,064,877 A | 11/1991 | Nass et al. | |
| 5,159,035 A | 10/1992 | Evani | |
| 5,484,867 A | 1/1996 | Lichtenhan et al. | |
| 5,534,312 A | 7/1996 | Hill et al. | |
| 5,559,200 A | 9/1996 | Suzuki et al. | |
| 5,664,041 A | 9/1997 | Szum | |
| 5,739,232 A | 4/1998 | Hazell et al. | |
| 5,856,415 A | 1/1999 | Lagace et al. | |
| 6,194,504 B1 | 2/2001 | Nagel et al. | |
| 6,217,984 B1 | 4/2001 | Bruxvoort et al. | |
| 6,291,070 B1 | 9/2001 | Arpac et al. | |
| 6,432,526 B1 | 8/2002 | Arney et al. | |
| 6,553,169 B2 | 4/2003 | Fabian | |
| 6,656,990 B2 | 12/2003 | Shustack et al. | |
| 6,844,950 B2 | 1/2005 | Ja Chisholm et al. | |
| 6,846,572 B2 | 1/2005 | Yamaguchi et al. | |
| 7,083,831 B1 | 8/2006 | Koch et al. | |
| 7,629,424 B2 | 12/2009 | Malik et al. | |
| 7,888,441 B2 | 2/2011 | Schwab | |
| 8,007,989 B1 | 8/2011 | Dougherty | |
| 8,648,157 B2 | 2/2014 | Schwab | |
| 8,709,705 B2 | 4/2014 | Malik et al. | |
| 8,802,346 B2 | 8/2014 | Malik et al. | |
| 8,852,690 B2 | 10/2014 | Karkkainen | |
| 9,454,076 B2 | 9/2016 | Yang et al. | |
| 9,499,646 B2 | 11/2016 | Yamashita et al. | |
| 2002/0037481 A1 | 3/2002 | Lee et al. | |
| 2002/0082323 A1 | 6/2002 | Chawla et al. | |
| 2003/0059544 A1 | 3/2003 | Bravo-Vasquez et al. | |
| 2003/0073042 A1 | 4/2003 | Cernigliaro et al. | |
| 2004/0026258 A1 | 2/2004 | No et al. | |
| 2004/0164293 A1 | 8/2004 | Maloney et al. | |
| 2004/0171743 A1 | 9/2004 | Flaim et al. | |
| 2005/0131175 A1 | 6/2005 | Weck et al. | |
| 2007/0075628 A1 | 4/2007 | Lewis et al. | |
| 2007/0287747 A1 | 12/2007 | Finmans et al. | |
| 2008/0083299 A1 | 4/2008 | Simone et al. | |
| 2008/0150184 A1 | 6/2008 | Chiruvolu et al. | |
| 2011/0184139 A1* | 7/2011 | Malik | C23C 18/14 526/240 |
| 2012/0184103 A1 | 7/2012 | Ogihara et al. | |

FOREIGN PATENT DOCUMENTS

| | | |
|---|---|---|
| JP | H06102668 A | 4/1994 |
| JP | H10229080 A | 8/1998 |
| JP | 2005213567 A | 8/2005 |
| JP | 2008163152 A | 7/2008 |
| JP | 2011207693 A | 10/2011 |
| WO | 03106734 A2 | 12/2003 |

OTHER PUBLICATIONS

Supplementary European Search Report dated May 16, 2019 for European Patent Application No. 15905553.2.

Coughlin, E. Bryan, "Silsesquioxane based Inorganic Organic Hybrid Copolymers".

"Brewer Science Offers Novel High Refractive Index Polymers"—www.brewerscience.com.

Wang, Yubao et al., "Hybrid high refractive index polymer coatings".

Oviatt, Henry W., "Polyhedral Oligomeric SilSesquioxane (POSS) Fillers as Refractive Index Enhancers for Silicone Intraocular Lenses, 18-9333".

Skrtic, D. et al., "Dental composites based on hybrid and surface-modified amorphous calcium phosphates", Biomaterials 25 (2004), pp. 1141-1150.

Skrtic, D. et al., "Volumetric contraction and methacrylate conversion in photo-polymerized amorphous calcium phosphate/methacrylate composites", Biomaterials 24 (2003).

Schubert, Ulrich et al., "Inorganic-Organic Hybrid Polymers from Surface-Modified Oxometallate Clusters", Mat. Res. Soc. Symp. Proc. (2000) vol. 628, CC2.3.1-CC2.3.11.

International Search Report and Written Opinion dated Jun. 26, 2006 for International Application No. PCT/US05/44670.

International Search Report and Written Opinion dated Feb. 12, 2008 for International Application No. PCT/US06/22885.

International Search Report and Written Opinion dated Nov. 13, 2009 for International Application No. PCT/US09/03841.

International Search Report and Written Opinion dated Jan. 4, 2016 for International Application No. PCT/US2015/052875.

* cited by examiner

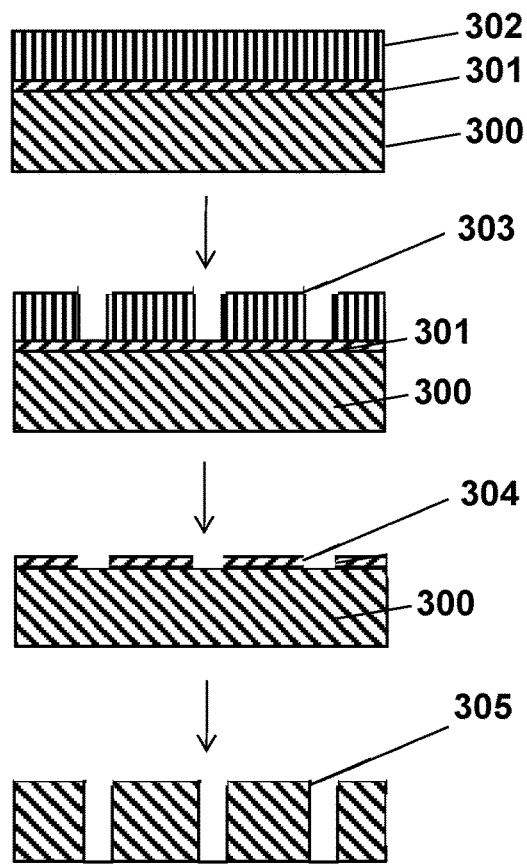
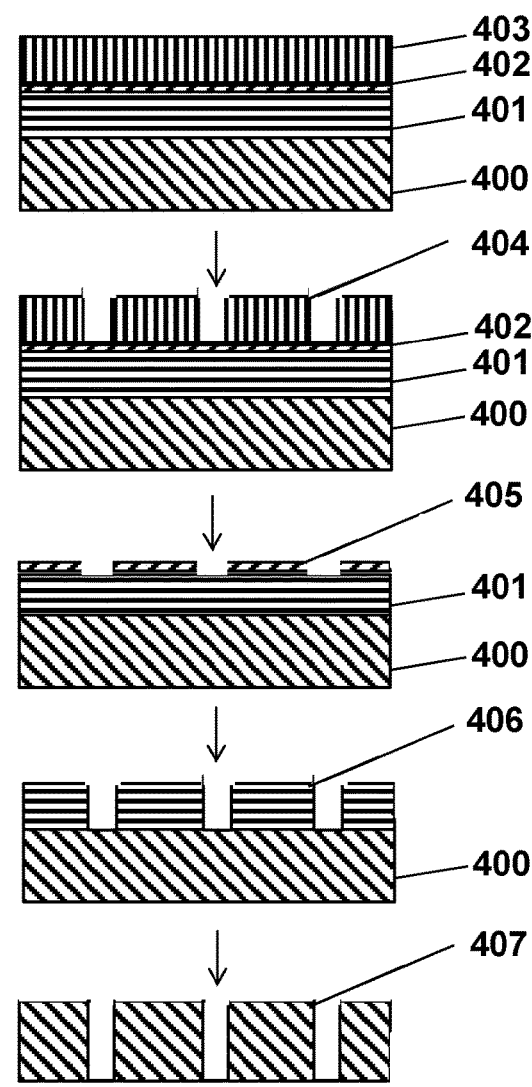
Figure 3
Figure 4

METAL COMPOSITIONS AND METHODS OF MAKING SAME

FIELD

The disclosed embodiments relate to processes for producing refined metal-containing units and their applications in forming films, patterned films, and three-dimensional objects or articles useful in producing semiconductor devices.

BACKGROUND

Use of metal-containing, film-forming materials and their applications is well known. For example, U.S. Pat. No. 7,692,424, U.S. Pat. No. 7,888,441, U.S. Pat. No. 8,648,157, U.S. Pat. No. 8,709,705, and U.S. Pat. No. 8,802,346 describe metal-containing units that react to combine the ligands and become insoluble in organic solvent when exposed to a source of radiation or heat and are capable of direct patterning. Hill et al in U.S. Pat. Nos. 5,534,312 and 7,176,114 describe direct patterning into metal-containing materials where the metal complex is photosensitive and undergoes low-temperature reaction in the presence of light of particular wavelength rendering the exposed portion insoluble in solvent/developer. Metal-containing units commonly employed for such applications are Ti, Hf and Zr. These materials are often contaminated with unacceptably high levels of impurities such as ions of sodium, aluminum, iron, calcium, magnesium and chloride (Recasens, et al. U.S. Pat. No. 5,002,749, Yamagata, C., Andrade, J. B., Ussui, V., Lima, N. B. and Paschoal, J. O. A. "High purity zirconia and silica powders via wet process: alkali fusion of zircon sand", Materials Science Forum, Vol. 591-593, 2008, pp 771-776).

Ionic contamination causes yield losses in Si devices by causing defects in the electrical field (*Handbook of Silicon Wafer Cleaning Technology*, (Reinhardt, K. and Kern, W., eds.), William Andrew, N Y (2008), pp 19). While metals such as calcium, potassium, sodium and iron may interfere with the electrical performance of device, other ionic impurities such as chlorides cause serious corrosion issues. Stowers et al in U.S. Pat. Application Publication No. 2011/029388 describes a photosensitive metal complex capable of direct patterning which contains alkali metals and ions like chlorides. A commonly used method to purify refractory metal precursors is multiple steps of distillation (Reuter, et al. U.S. Pat. No. 7,273,943). These distillations are normally carried out under conditions of high temperatures and reduced pressures. High temperatures involved in the process of purification can cause undesirable side reactions resulting in byproducts. For example distillation of alkoxides of zirconium can result in the formation of high molecular weight oligomers that need to be carefully separated from pure zirconium alkoxide by fractional distillation. Distillations of reactive compounds used as ligands in metal complexes can result in crosslinking and polymerization. Low overall product yields and high cost of process, severely restricts the commercial viability of such materials for volume manufacturing. An objective of the embodiments described herein is to provide a novel process for producing metal-containing units with reduced levels of yield impurities. In other aspects, applications of such refined metal-containing units in commonly used semiconductor processes are also provided.

SUMMARY

One embodiment is a process for reducing yield impurities in metal-containing unit (MU) to prepare a refined metal-containing unit (RMU).

The MU is represented by Structure I:

$$MA_wB_xC_y \qquad \text{Structure I}$$

where M comprises a metal with a formal valency of 0-7 and is selected from Zr, Hf, Ge, Ti, Nb, Pb, Gd, Sn, Ce, Eu, In, Nd, Sb, Ga, Se, Cd, Ta, Co, Pt, Au, W, V, Tl, Te, Sr, Sm, La, Er, Pd, In, Ba, As and Y; The A, B, and C groups may be selected to impart reactivity and impart compatibility with a variety of prepolymers and organic solvents and to form an optically clear film or article; Ligand A contains a reactive functional group capable of undergoing a combining reaction; w is 0 to 7; Ligands B and C are selected for metal-ligand photolysis and film-forming properties; and x and y are 0 to 7.

In this embodiment RMU is formed by a process comprising mixing a solution of MU with deionized water wherein pH of deionized water is adjusted in the range of from about 2 to about 5.5.

In one aspect, solution of MU is provided in organic solvent system comprising at least one organic solvent that is miscible in water such that MU solution and water form one phase.

MU solution is added dropwise to stirring deionized water such that RMU is formed as a solid mass. The solid RMU thus formed is isolated either by decanting off all liquids or by centrifugation or by filtration through an appropriate filter media. RMU is further dried in a vacuum oven under reduced pressure at a temperature less than 150° C. A portion of RMU sample is subjected to yield impurity analysis.

In another aspect, a solution of MU is provided in an organic solvent system comprising at least one water immiscible organic solvent. The water immiscible organic solvent has low to no miscibility in water such that MU solution and water form two separate phases at rest. Such MU solution is mixed with deionized water adjusted to a pH in the range of from about 2 to about 5.5. When mixing is stopped, organic phase separates from the aqueous phase. The aqueous phase is discarded. The RMU thus formed remains in the organic phase. A small portion of the RMU solution thus obtained is subjected to yield impurity analysis.

In embodiments, the process reduces the yield impurities to levels of below 5000 parts per billion (ppb), or below 2500 ppb, or below 1000 ppb, or below 500 ppb based on the total weight of RMU for each yield impurity.

In embodiments, the process reduces each yield impurity by at least 15% of the original yield impurity content, or by at least 40%, or by at least 75%. The following embodiments provide processes for the use of compositions comprising RMU in producing semiconductor devices.

Patterned substrates and doped patterned substrates are commonly employed in producing semiconductor devices.

In yet another embodiment is provided a process for forming a patterned substrate comprising a) providing a RMU, b) preparing a composition comprising RMU, c) providing a substrate, d) depositing said composition on the substrate, e) drying said composition at a temperature below 200° C., f) forming a pattern in film comprising RMU, and g) transferring said pattern to the substrate by means of etching to produce patterned substrate.

Composition comprising RMU may contain additives such as a catalyst or initiator, monomers, polymers, dyes or colorants, surfactants or leveling agents, and adhesion promoters as well as solvent to impart film forming properties. For example, an initiator or a catalyst can be used to induce a combining reaction in RMU. A dye can be used to adjust absorbance of the deposited composition comprising RMU such that it absorbs more light at a particular wavelength at which it is exposed. A solvent can be used to adjust film thickness.

Substrate comprises individually or in combination at least one element selected from the group consisting of Si, O, N, Al, Cu, C, Ga, Ge, As, Zn and W.

Pattern in RMU comprising composition can be formed by exposing the said composition to a source of radiation via a mask, a reticle or a mold. The unexposed portion of the said composition is removed with a suitable developer. Source of radiation can be selected individually or in combination from broadband light of wavelength higher than 300 nm, g-line at wavelength of about 405 nm, i-line at wavelength of about 365 nm, deep ultra-violet light at wavelengths of 248 nm and 193 nm, electron-beam, X-ray beam or extreme ultraviolet light.

Non-limiting examples of etching used to transfer patterns are dry etching and wet etching. Etching may take single or multiple steps. Dry etching can be physical removal of material by plasma, a chemical removal of material by gases, or a combination of physical and chemical removal called reactive ion etching. Wet etching involves contact with liquids that are known to dissolve and remove materials.

Alternatively, patterns in compositions comprising RMU can be generated by a process comprising 1) providing a photoresist, 2) depositing said photoresist on the film comprising RMU, 3) drying said photoresist at a temperature below 200° C., 4) forming a pattern in said photoresist film and 5) transferring said pattern to the film comprising RMU by means of etching.

In another embodiment is provided a process for forming a doped patterned substrate. The process comprises a) providing a RMU, b) preparing a composition comprising RMU c) providing a substrate, d) depositing said composition on substrate e) drying said composition at a temperature below 200° C., f) forming a pattern in the film comprising RMU, and g) depositing dopants into the exposed portion of the substrate using a reactive ion beam. Ion implantation introduces dopant to the exposed underlying substrate by reactive ion beam.

Another embodiment is a process of forming a refined metal-containing unit (RMU) comprising: providing a metal-containing unit (MU) where MU is represented by Structure I:

$$MA_wB_xC_y \qquad \text{Structure I}$$

where M comprises a metal with a formal valency of 0-7 and is selected from Zr, Hf, Ge, Ti, Nb, Pb, Gd, Sn, Ce, Eu, In, Nd, Sb, Ga, Se, Cd, Ta, Co, Pt, Au, W, V, Tl, Te, Sr, Sm, La, Er, Pd, In, Ba, As and Y; Ligand A contains a reactive functional group capable of undergoing a combining reaction; w is 0 to 7; Ligands B and C are selected individually or in combination from oxygen, nitrogen, sulfur, or a halogen atom; hydroxyl, peroxo, phosphate, borate, tungstate, sulfate, silicate; substituted or unsubstituted linear, branched or cyclic alkyl, alkyl ether, alkyl ester, thioalkyl, alkenyl or alkynyl group; substituted or unsubstituted aryl group; and —XR$^1$ where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and R$^1$ represents a hydrogen atom, substituted or unsubstituted linear, branched or cyclic alkyl or thioalkyl group, a heterocyclic group, an alicyclic group, and a substituted or unsubstituted aryl or heteroaryl group; x and y are 0 to 7, and w+x+y is 2-7; dissolving the MU in an organic solvent, the MU being present in the range of about 5 weight percent to about 70 weight percent based on the total weight of the MU and the organic solvent, to form an MU solution, and providing an acidified solution of deionized water at a pH below 6.5 by adding an acid to deionized water, the acid being represented by the structure R$^2$—COOH, wherein R$^2$ is selected individually or in combination from substituted or unsubstituted linear, branched or cyclic alkyl, alkenyl or alkynyl group, alkyl ester, alkenyl ester, alkenyl ether or alkyl ether; substituted or unsubstituted aryl group The process further comprises mixing the MU solution with the acidified solution of deionized water, and isolating the RMU.

Yet another embodiment is a composition comprising a refined metal-containing unit (RMU) comprising at least one member selected from the group consisting of a unit represented by Structure I:

$$MA_wB_xC_y \qquad \text{Structure I}$$

where M comprises a metal with a formal valency of 0-7 and is selected from Zr, Hf, Ge, Ti, Nb, Pb, Gd, Sn, Ce, Eu, In, Nd, Sb, Ga, Se, Cd, Ta, Co, Pt, Au, W, V, Tl, Te, Sr, Sm, La, Er, Pd, In, Ba, As and Y; Ligand A contains a reactive functional group capable of undergoing a combining reaction; w is 0 to 7; Ligands B and C are selected individually or in combination from oxygen, nitrogen, sulfur, or a halogen atom; hydroxyl, peroxo, phosphate, borate, tungstate, sulfate, silicate; substituted or unsubstituted linear, branched or cyclic alkyl, alkyl ether, alkyl ester, thioalkyl, alkenyl or alkynyl group; substituted or unsubstituted aryl group; and —XR$^1$ where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and R$^1$ represents a hydrogen atom, substituted or unsubstituted linear, branched or cyclic alkyl or thioalkyl group, a heterocyclic group, an alicyclic group, and a substituted or unsubstituted aryl or heteroaryl group; x and y are 0 to 7, and w+x+y is 2-7, wherein the composition contains a reduced quantity of yield impurities.

Yet another embodiment is a composition comprising a refined metal-containing unit (RMU) comprising at least one member selected from the group consisting of a unit represented by Structure I $$MA_wB_xC_y \qquad \text{Structure I}$$

where M comprises at least one metal selected from the group consisting of Zr, Hf, Ge, Ti, Nb, Pb, Gd, Sn, Ce, Eu, In, Nd, Sb, Ga, Se, Cd, Ta, Co, Pt, Au, W, V, Tl, Te, Sr, Sm, La, Er, Pd, In, Ba, As and Y; Ligand A contains a reactive functional group capable of undergoing a combining reaction; w is 1 to 7; Ligands B and C are selected individually or in combination from oxygen, nitrogen, sulfur, a halogen atom substituted or unsubstituted linear, branched or cyclic alkyl, alkyl ether, alkyl ester, thioalkyl, alkenyl or alkynyl group; substituted or unsubstituted aryl group; and —XR$^1$ where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and R$^1$ represents a linear, branched or cyclic alkyl or thioalkyl group, a heterocyclic group, an alicyclic group, and a substituted or unsubstituted aryl or heteroaryl group; and x and y are 0 to 6; wherein at least a portion of the metal-containing unit contains at least one reactive functional group, and the composition contains a reduced quantity of yield impurities.

A further embodiment is a process of forming a patterned substrate comprising providing a refined metal-containing unit (RMU), and preparing a composition comprising RMU, the RMU being represented by Structure I $$MA_wB_xC_y \qquad \text{Structure I}$$

where M comprises at least one metal selected from the group consisting of Zr, Hf, Ge, Ti, Nb, Pb, Gd, Sn, Ce, Eu, In, Nd, Sb, Ga, Se, Cd, Ta, Co, Pt, Au, W, V, Tl, Te, Sr, Sm, La, Er, Pd, In, Ba, As and Y; Ligand A contains a reactive functional group capable of undergoing a combining reaction; w is 1 to 7; Ligands B and C are selected individually or in combination from oxygen, nitrogen, sulfur, a halogen atom substituted or unsubstituted linear, branched or cyclic alkyl, alkyl ether, alkyl ester, thioalkyl, alkenyl or alkynyl group; substituted or unsubstituted aryl group; and $-XR^1$ where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and $R^1$ represents a linear, branched or cyclic alkyl or thioalkyl group, a heterocyclic group, an alicyclic group, and a substituted or unsubstituted aryl or heteroaryl group; and x and y are 0 to 6; wherein at least a portion of the metal-containing unit contains at least one reactive functional group. The process further comprises providing a substrate, depositing the composition comprising RMU to form a film on the substrate, drying the film comprising RMU at a temperature less than 200° C., forming a pattern in the film comprising RMU, and transferring a pattern to the substrate.

BRIEF DESCRIPTION OF DRAWINGS

FIG. 3 is a schematic diagram illustrating a process for pattern transfer of a patterned photoresist film through a film comprising RMU into a substrate.

FIG. 4 is a schematic diagram illustrating a process for pattern transfer of a patterned photoresist film through a film comprising RMU and organic layer into a substrate.

DETAILED DESCRIPTION

Figure 1:
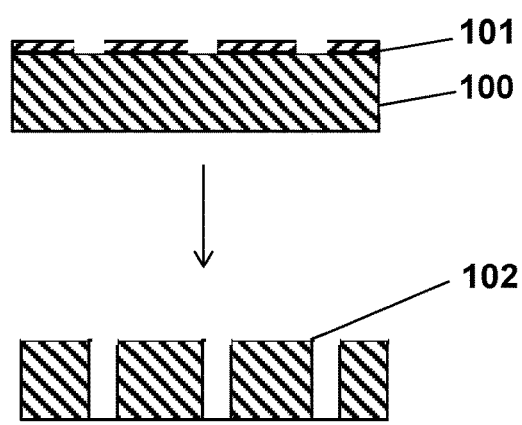
FIG. 1 is a schematic diagram illustrating a process for pattern transfer of a patterned film comprising RMU into a substrate.

As used herein, the term "yield impurity" means ionic or nonionic compounds which contaminate devices, causing electrical yield losses. Non-limiting examples of yield impurities comprise metallic impurities and nonmetallic impurities. Non-limiting examples of yield impurities include sodium, aluminum, iron, calcium, magnesium, potassium, zinc, copper, chromium, manganese and chloride. For example, iron can be present as a metal particulate or as an ionic species in solution.

The term "refined' is used to indicate that yield impurities are reduced.

The term "ligand" as used herein refers to molecules, ions or atoms attached to the central atom of a coordination compound, a chelate or other complex.

The term "combining reaction" as used herein refers to polymerization and/or crosslinking reactions of reactive functional groups. The crosslinking is usually chemical crosslinking but in some cases can be physical crosslinking. Combining reactions can take place with RMU and RMU and with RMU and various other components.

The term "reactive functional group" as used herein refers to functional groups such as epoxide, —SiH, a —SH group and ethylenically unsaturated functional groups such as a vinyl group, an allyl group, a (meth)acryloyl group.

Combining reactions include reactions of ethylenically unsaturated functional groups, reactions involving ethylenically unsaturated functional groups with a —SiH group or a —SH group and reactions involving epoxides, —SiH and —SH groups.

The prefix "(meth)acryl" as used herein refers to either an acryl or a methacryl group.

The term "direct writing" refers to a process of scanning a focused beam of light or electrons to draw custom patterns on film without the use of a mask or mold. The light or electron beam changes the solubility of the photosensitive composition, enabling selective removal of either the exposed or non-exposed regions of the photosensitive composition by immersing it in a developer.

The term "photoresist" refers to any photosensitive composition when exposed to radiation such as light or electron beam changes solubility in developer. One type of photoresist called negative tone becomes insoluble in developer in the exposed area. Another type of photoresist called positive tone becomes soluble in developer in the exposed area.

The term "laser ablation" is the removal of material from a film or substrate by direct absorption of laser energy through a mask.

As used herein, "electronic devices" are devices made using microfabrication or nanofabrication technologies. Non-limiting examples of electronic or semiconductor devices include integrated circuits, microsensors, MEMS, inkjet nozzles, micro-optics, fiber optics telecommunications devices, flat panel displays and laser diodes.

One embodiment is a process for reducing yield impurities in metal-containing unit (MU) to prepare a refined metal-containing unit (RMU).

The MU is represented by Structure I:

$$MA_wB_xC_y \qquad \text{Structure I}$$

In Structure I, M comprises a metal with a formal valency of 0-7 and is selected from Zr, Hf, Ge, Ti, Nb, Pb, Gd, Sn, Ce, Eu, In, Nd, Sb, Ga, Se, Cd, Ta, Co, Pt, Au, W, V, Tl, Te, Sr, Sm, La, Er, Pd, In, Ba, As and Y.

Ligand A contains a reactive functional group capable of undergoing a combining reaction; w is 0 to 7. Ligand A contains a reactive functional group such as substituted or unsubstituted (meth)acryloyl, vinyl, allyl, styryl, cyclic olefinic group, an epoxide group, a SiH group, and a SH group.

Ligands B and C are selected individually or in combination from oxygen, nitrogen, sulfur, or a halogen atom; hydroxyl, peroxo, phosphate, borate, tungstate, sulfate, silicate; substituted or unsubstituted linear, branched or cyclic alkyl, alkyl ether, alkyl ester, thioalkyl, alkenyl or alkynyl group; substituted or unsubstituted aryl group; and $-XR^1$ where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and $R^1$ represents a hydrogen atom, substituted or unsubstituted linear, branched or cyclic alkyl or thioalkyl group, a heterocyclic group, an alicyclic group, and a substituted or unsubstituted aryl or heteroaryl group; and x and y are 0 to 7. An example of an alkynyl group is acetylene. An example of substituted or unsubstituted linear, branched or cyclic alkyl ether group is succinic acid terminated polyethylene glycol. An example of substituted linear alkyl is pentafluoroethyl. Some examples of a carbanion are 2,2-dimethyl-4,6-dioxo-1,3-dioxan-5-ide, dicyanomethanide, cyclopenta-2,4-dienide, and phenylethynide.

In embodiments, w is 1 to 7. In one aspect the MU is similar to those described in issued patent applications U.S. Pat. No. 7,692,424, U.S. Pat. No. 7,888,441, U.S. Pat. No. 8,648,157, U.S. Pat. No. 8,709,705 and U.S. Pat. No. 8,802,346 and are incorporated herein as reference.

An example of MU can be $Zr(O)(CH_2CO_2C(CH_3))_2$, zirconyl dimethacrylate, in which case A is methacrylate, B is oxygen, w=2, x=1, y=0, and w+x+y=3.

Other non-limiting examples of metal-containing precursor unit (MU) are zirconium (meth)acrylate, zirconyl di(meth)acrylate, zirconium butoxide (meth)acrylate, zirconium carboxyethyl acrylate, zirconium vinyl acetate, zirconyl di(vinyl acetate), zirconium 3-oxatricyclo[3.2.1.0$^{2,4}$]octane-6-carboxylate, zirconium 2-bromo-5-oxo-4-oxatricyclo[4.2.1.0$^{3,7}$]nonane-9-carboxylate (meth)acrylate, zirconium 6-(2-naphthylthio)bicyclo[2.2.1] heptane-2-carboxylate (meth)acrylate, zirconium [(1S,4R)-7,7-dimethyl-2-oxobicyclo[2.2.1]hept-1-yl]methanesulfonate 2-naphthalenethiolate (meth)acrylate, zirconium oxy hydroxysulfate, zirconium oxy hydroxytungstate, zirconium oxy hydroxyphosphate, zirconium oxy hydroxyborate, zirconium oxy hydroxysilicate, hafnium (meth)acrylate, hafnium butoxide (meth)acrylate, hafnium oxide di(meth)acrylate, hafnium carboxyethyl acrylate, hafnium vinyl acetate, and hafnium oxide di(vinyl acetate), hafnium 3-oxatricyclo[3.2.1.0$^{2,4}$]octane-6-carboxylate, hafnium 2-bromo-5-oxo-4-oxatricyclo[4.2.1.0$^{3,7}$]nonane-9-carboxylate (meth)acrylate, hafnium 6-(2-naphthylthio)bicyclo[2.2.1] heptane-2-carboxylate (meth)acrylate, hafnium [(1 S,4R)-7,7-dimethyl-2-oxobicyclo[2.2.1]hept-1-yl]methanesulfonate 2-naphthalenethiolate (meth)acrylate, hafnium oxy hydroxysulfate, hafnium oxy hydroxytungstate, hafnium oxy hydroxyphosphate, hafnium oxy hydroxyborate, hafnium oxy hydroxysilicate, titanium (meth)acrylate, titanium butoxide (meth)acrylate, titanium oxide di(meth)acrylate, titanium carboxyethyl acrylate, titanium vinyl acetate, titanium oxide di(vinyl acetate), titanium 3-oxatricyclo[3.2.1.0$^{2,4}$]octane-6-carboxylate, titanium 2-bromo-5-oxo-4-oxatricyclo[4.2.1.0$^{3,7}$]nonane-9-carboxylate (meth)acrylate, titanium 6-(2-naphthylthio)bicyclo[2.2.1] heptane-2-carboxylate (meth)acrylate, titanium [(1 S,4R)-7,7-dimethyl-2-oxobicyclo[2.2.1]hept-1-yl]methanesulfonate 2-naphthalenethiolate (meth)acrylate, titanium oxy hydroxysulfate, titanium oxy hydroxytungstate, titanium oxy hydroxyphosphate, titanium oxy hydroxyborate, titanium oxy hydroxysilicate, titanium diisopropoxide bis(ethyl acetoacetate), titanium diisopropoxide bis(2,4-pentanedionate), di-n-butoxydi(meth)acryloxygermane, tetracarboxyethylacryloxygermane, tetravinylacetoxygermane, tetra(meth)acryloxygermane, 3-oxatricyclo[3.2.1.0$^{2,4}$]octane-6-carboxygemane, 2-bromo-5-oxo-4-oxatricyclo[4.2.1.0$^{3,7}$]nonane-9-carboxytri(meth)acryloxygermane, 6-(2-naphthylthio)bicyclo[2.2.1] heptane-2-carboxytri(meth)acryloxygermane, tantalum (meth)acrylate, tantalum butoxide (meth)acrylate, tantalum carboxyethyl acrylate, tantalum vinyl acetate, tantalum 3-oxatricyclo[3.2.1.0$^{2,4}$]octane-6-carboxylate, tantalum 2-bromo-5-oxo-4-oxatricyclo[4.2.1.0$^{3,7}$]nonane-9-carboxylate (meth)acrylate, tantalum 6-(2-naphthylthio)bicyclo[2.2.1] heptane-2-carboxylate (meth)acrylate, tantalum oxy hydroxysulfate, tantalum oxy hydroxytungstate, tantalum oxy hydroxyphosphate, tantalum oxy hydroxyborate, tantalum oxy hydroxysilicate, niobium (meth)acrylate, niobium butoxide (meth)acrylate, niobium carboxyethyl acrylate, niobium vinyl acetate, niobium 3-oxatricyclo[3.2.1.0$^{2,4}$]octane-6-carboxylate, niobium 2-bromo-5-oxo-4-oxatricyclo[4.2.1.0$^{3,7}$]nonane-9-carboxylate (meth)acrylate, niobium 6-(2-naphthylthio)bicyclo[2.2.1] heptane-2-carboxylate (meth)acrylate, tungsten pentacarbonyl triphenylphosphine, cerium tris(2-ethylhexanoate), barium bis(2-ethylhexanoate), yttrium tris (2-ethylhexanoate) and yttrium trihexanoate.

In embodiments, non-limiting examples of RMU are compounds of zirconium, hafnium and titanium comprising ligands of (meth)acrylate or carboxyethyl acrylate. In embodiments containing ligands of (meth)acrylate or carboxyethyl acrylate, additional ligands also may be present.

In this embodiment RMU is formed by a process comprising mixing a solution of MU with deionized water wherein pH of deionized water is adjusted in the range of from about 2 to about 5.5. The pH of deionized water used is adjusted by the addition of an acid represented by $R^2COOH$ where $R^2$ is selected individually or in combination from substituted or unsubstituted linear, branched or cyclic alkyl, alkenyl or alkynyl group, alkyl ester, alkenyl ester, alkenyl ether or alkyl ether; substituted or unsubstituted aryl group. Non-limiting examples of $R^2$ are methyl, trifluoromethyl, ethyl, pentafluoroethyl, propyl, heptafluoropropyl, butyl, vinyl, prop-2-enyl, 1,1,1-trifluoroprop-2-enyl, (2-acryloxy)ethyl, and phenyl. Non-limiting examples of $R^2COOH$ are acetic acid, trifluoroacetic acid, heptafluorobutanoic acid, acrylic acid, methacrylic acid, α-trifluoromethyl acrylic acid, 2-carboxyethyl acrylate, and benzoic acid.

Deionized water used in embodiments is described in ASTM D5127 with a resistivity measurement of >12 Megaohms-cm.

In one aspect, solution of MU is provided in organic solvent system comprising at least one organic solvent that is miscible in water such that MU solution and water form one phase. Non-limiting examples of such water miscible organic solvents are methanol, ethanol, n-propanol, isopropanol, t-butyl alcohol, 1-methoxy-2-propanol, 2-propoxyethanol, 2-butoxyethanol, 2-ethoxyethyl ether, 2-butoxyethyl ether, dimethyl sulfoxide, γ-butyrolactone, acetonitrile, ethyl lactate, N-methyl pyrollidone, dimethyl formamide, tetrahydrofurfuryl alcohol, tetrahydrofuran and acetone. Such water miscible organic solvents are selected individually or in combination from above list.

The typical concentration range of the MU solution is from about 5 to about 70 weight % of MU based on the total weight of MU and the organic solvent.

The MU solution may be filtered by microfiltration, ultrafiltration and nanofiltration techniques. The membrane filter pore size involved in filtration techniques can range from about 0.001 to about 25 micron, or about 0.05 to about 10 micron, or about 0.1 to about 5 micron.

MU solution is added dropwise to stirring deionized water such that RMU is formed as a solid mass. The solid RMU thus formed is isolated either by decanting off all liquids or by centrifugation or by filtration through an appropriate filter media. RMU is further dried in a vacuum oven under reduced pressure at a temperature less than 150° C. A portion of RMU sample is subjected to yield impurity analysis.

The above process may be repeated until each yield impurity remaining is below 5000 ppb based on solid weight of RMU. To repeat the process, solid RMU is dissolved in water miscible solvent systems.

The precipitate of RMU formed is alternatively dissolved in an additional organic solvent with a boiling point of 115° C. or higher. Non-limiting examples of such additional organic solvents are 2-heptanone, cyclopentanone, cyclohexanone, 1-methoxy-2-propanol, 2-methoxyethanol, 2-ethoxyethanol, 4-methyl-2-pentanol, ethylene glycol monoisopropyl ether, 2-propoxyethanol, 2-butoxyethanol, 2-ethoxyethyl ether, 2-butoxyethyl ether, diethylene glycol monoethyl ether, diethylene glycol monomethyl ether, diethylene glycol dimethyl ether, 1-methoxy-2-propyl acetate, 2-ethoxyethyl acetate, 1,2-dimethoxy ethane ethyl acetate, cellosolve acetate, methyl lactate, ethyl lactate, n-butyl acetate, methyl pyruvate, ethyl pyruvate, methyl 3-methoxypropionate, ethyl 3-methoxypropionate, tetrahydrofurfuryl alcohol, tetraethylene glycol, 4-hydroxy-4-methyl-2-pentanone, 4-methyl-2-pentanone, γ-butyrolactone, dimethylsulfoxide, dimethyl formamide, and N-methyl-2-pyrrolidone. Such organic solvents are selected individually or in combination from above list.

In another aspect, solution of MU is provided in organic solvent system comprising at least one water immiscible organic solvent. The water immiscible organic solvent has low to no miscibility in water such that MU solution and water form two separate phases at rest. Such MU solution is mixed with deionized water adjusted to a pH in the range of from about 2 to about 5.5 as described above. When mixing is stopped, organic phase separates from the aqueous phase. The aqueous phase is discarded. The RMU thus formed remains in the organic phase. A small portion of the RMU solution thus obtained is subjected to yield impurity analysis.

Non-limiting examples of water immiscible organic solvents are ethyl acetate, propyl acetate, butyl acetate, 1-methoxy-2-propyl acetate, n-butanol, 4-methyl-2-pentanol, hexanes, heptane, toluene, 2-methyl tetrahydrofuran, 2-butanone, 4-methyl-2-pentanone, 2-heptanone, cyclopentanone, cyclohexanone, methyl t-butyl ether, and cyclopentyl methyl ether. Such water immiscible organic solvents may be selected individually or in combination from the above list.

The RMU may be isolated as a solution in concentration range from about 1 weight % to about 90 weight %, or from about 15 weight % to about 85 weight % (intermediate range), or from about 25 weight % to about 80 weight % (narrow range).

The above process may be repeated until each yield impurity remaining is below 5000 ppb based on solid weight of RMU. To repeat the process, RMU solution is mixed with additional deionized water adjusted to a pH in the range of from about 2 to about 5.5.

The processes described above are effective for reducing yield impurities to levels of below 5000 parts per billion (ppb), or below 1000 ppb, or below 500 ppb based on the total weight of RMU for each yield impurity. In embodiments, the process reduces the overall yield impurity content to below 500 ppm, or below 100 ppm, or below 50 ppm based on the total weight of the RMU.

Both aspects of the embodiment providing a process for forming RMU reduces each yield impurity by at least 15% of the original yield impurity content, or by at least 40%, or by at least 75%. In embodiments, the process reduces the overall yield impurity by at least 15% of the original overall yield impurity content, or by at least 40%, or by at least 75%.

The following embodiments provide processes for the use of compositions comprising RMU in processes used in producing semiconductor devices.

Patterned substrates and doped patterned substrates are commonly employed in producing semiconductor devices.

In yet another embodiment is provided a process for forming a patterned substrate comprising a) providing a RMU, b) preparing a composition comprising RMU, c) providing a substrate, d) depositing said composition on the substrate, e) drying said composition at a temperature below 200° C., f) forming a pattern in film comprising RMU, and g) transferring said pattern to the substrate by means of etching to produce patterned substrate.

RMU is described in above embodiment.

Composition comprising RMU may be prepared by mixing with additives such as a catalyst or initiator, monomers, polymers, dyes or colorants, surfactants or leveling agents, and adhesion promoters as well as solvent to impart certain functional features to the composition deposited on substrate. For example, an initiator or a catalyst can be used to induce a combining reaction in RMU. A dye or a sensitizer can be used to adjust absorbance of the deposited composition comprising RMU such that it absorbs more light at a particular wavelength at which it is exposed. A solvent can be used to impart film forming properties and adjust thickness of the deposited composition.

The catalyst or initiator used in composition comprising RMU induces a combining reaction of reactive functional groups of RMU when activated by irradiation or heat. A photoactive catalyst or photoinitiator used in the composition is a compound that absorbs light at the wavelength of exposure and is capable of catalyzing combining reactions of the RMU and/or other various components, when deposited composition or a portion of deposited composition is exposed to light. Non-limiting examples of photoinitiators include 2-hydroxy-2-methyl-1-phenylpropan-1-one, 1-hydroxycyclohexyl phenyl ketone (Irgacure 184 from Ciba Specialty Chemical), a blend of 1-hydroxycyclohexylphenylketone and benzophenone (Irgacure 500 from Ciba Specialty Chemical), 2,4,4-trimethylpentyl phosphine oxide (Irgacure 1800, 1850, and 1700 from Ciba Specialty Chemical), 2,2-dimethoxyl-2-acetophenone (Irgacure 651 from Ciba Specialty Chemical), bis(2,4,6-trimethyl benzoyl)phenyl-phosphine oxide (Irgacure 819 from Ciba Specialty Chemical), (2,4,6-trimethylbenzoyl)diphenyl phosphine oxide (Lucerin TPO from BASF), ethoxy(2,4,6-trimethylbenzoyl)phenyl phosphine oxide (Lucerin TPO-L from BASF) and a blend of phosphine oxide, α-hydroxy ketone and a benzophenone derivative (ESACURE KTO46 from Sartomer).

An example of a photoactive catalyst is a photoacid generator ionic or nonionic such as triphenyl sulfonium triflate from Aldrich Catalog No. 526940 and 2-methyl-alpha-[2-[[(propylsulfonyl)oxy]imino]-3(2H)-thienylidene]-benzeneacetonitrile from BASF as Irgacure PAG 103.

Non-limiting examples of catalysts or initiators useful in inducing a combining reaction the presence of heat include but are not limited to organic peroxides such as benzoyl peroxide, diacylperoxides, peroxydicarbonates, alkylperesters, alkyl peroxides, perketals, ketoneperoxides, and alkylhydroperoxides; azo compounds such as azobisisobutyronitrile and 1,1'-azobis(cyclohexanecarbonitrile); and thermal acid generators such as cyclohexyltosylate and K-Cure 1040 from King Industries.

Catalysts or initiators described above may be used individually or in combination. In embodiments in which a catalyst or initiator is employed, the amount employed is up to about 20% by weight of RMU, or up to about 10% by weight of RMU, or up to about 6% by weight of RMU.

The composition comprising RMU may further comprise a prepolymer unit (PU) which contains at least two reactive functional groups. The term PU refers to a monomer unit or an oligomer where oligomer refers to combination of monomer units joined together. The PU may contain many monomer units and is capable of further reactions to be incorporated in the final material. Examples of such monomer units/oligomers are based on one or more of the following types: acrylate, ester, vinyl alcohol, urethane, urea, imide, amide, carbaxazole, carbonate, pyranose, siloxane, urea-formaldehyde and melamine-formaldehyde. The PU contains at least two terminal and/or pendant reactive functional groups. These can participate in combining reactions with RMU. Examples of such terminal and pendant groups are a vinyl group, an allyl group, a (meth)acryloyl group, an epoxy group, a SiH group and a —SH group. An important criterion in the selection of the RMU and the PU for the composition of this embodiment is that they are compatible with each other.

Non-limiting examples of PU include urethane acrylate oligomer. The term urethane acrylate oligomer refers to a class of compounds that contain urethane linkages and have (meth)acrylate functional groups such as urethane multi(meth)acrylate, multiurethane (meth)acrylate, and multiurethane multi(meth)acrylate. Types of urethane (meth)acrylate oligomers have been described by Coady et al. in U.S. Pat. No. 4,608,409 and by Chisholm et al. in U.S. Pat. No. 6,844,950 and are incorporated herein as references. Other non-limiting examples of PU include 1,6-hexanediol di(meth)acrylate, tetraethyleneglycol di(meth)acrylate, divinylbenzene, ethoxylated bisphenol-A-di(meth)acrylate, diethylene glycol bis(allyl carbonate), trimethylolpropane tri(meth)acrylate, ditrimethylolpropane tetra(meth)acrylate, pentaerythritol tri(meth)acrylate, pentaerythritol tetra(meth)acrylate, dipentaerythritol penta-/hexa-(meth)acrylate, isocyanurate tri(meth)acrylate, bis(2-hydroxyethyl)-isocyanurate di(meth)acrylate, 1,3-butanediol di(meth)acrylate, 1,4-butanediol di(meth)acrylate, neopentyl glycol di(meth)acrylate, (meth)acrylate modified-urea-formaldehyde, melamine-formaldehydecellulose and siloxanes having vinyl, allyl, (meth) acryloyol, or hydro-silane terminal or pendent functional groups. Non-limiting examples of such siloxane PU include vinyl-, epoxide- or (meth)acryl-terminated polyhedyrl oligomeric silsesquioxanes (POSS) (Hybrid Plastics codes OL1160, EP0409, MA0735 and MA0736), vinyl-containing siloxanes (CAS 68083-19-2, 68951-96-2, 225927-21-9, 67762-94-1, 68083-18-1, 597543-32-3, 131298-48-1 and 29434-25-1 and Gelest Code EDV-2025, VMS-005, VPE-005, VMS-T11, VTT-106 and MTV-124), hydride-containing siloxanes (CAS 70900-21-9, 68037-59-2, 69013-23-6, 63148-57-2, 68988-57-8 and 24979-95-1 and Gelest Code HDP-111).

In embodiments in which a PU is employed, the amount employed is up to about 100% by weight of RMU, or up to about 50% by weight of RMU, or up to about 25% by weight of RMU.

The composition comprising RMU may also comprise nanoparticles selected individually or in combination from surface treated or untreated silica, titania, zirconia, hafnia, CdSe, CdS, CdTe, lanthanum oxide, niobium oxide, tungsten oxide, and strontium oxide.

The composition comprising RMU may further comprise a co-monomer with only one reactive functional group. Non-limiting examples of co-monomer are (meth)acrylic acid, methyl (meth)acrylate, ethyl (meth)acrylate, hexyl (meth)acrylate, cyclohexyl (meth)acrylate, 2-ethylhexyl (meth)acrylate, tetrahydrofurfuryl (meth)acrylate, isobornyl (meth)acrylate, and hydroxyethyl (meth)acrylate.

The composition comprising RMU may also comprise a suitable solvent in the concentration range of from about 1 to about 70 weight percent. The choice of solvent for the formulation and the concentration thereof depends principally on the type of functionalities incorporated in the RMU and/or other various components and the coating method. The solvent should be inert, should dissolve or uniformly disperse all the components in the composition, should not undergo any chemical reaction with the components, and should be removable on drying after coating. Non-limiting examples of suitable solvents are 2-butanone, 3-methyl-2-butanone, 4-hydroxy-4-methyl-2-pentanone, 4-methyl-2-pentanone, 2-heptanone, cyclopentanone, cyclohexanone, 1-methoxy-2-propanol, 2-methoxyethanol, 2-ethoxyethanol, ethylene glycol monoisopropyl ether, 2-propoxyethanol, 2-butoxyethanol, 4-methyl-2-pentanol, tetraethylene glycol, 2-ethoxyethyl ether, 2-butoxyethyl ether, diethylene glycol monoethyl ether, diethylene glycol monomethyl ether, diethylene glycol dimethyl ether, 1-methoxy-2-propyl acetate, 2-ethoxyethyl acetate, 1,2-dimethoxy ethane ethyl acetate, cellosolve acetate, methyl lactate, ethyl lactate, n-butyl acetate, methyl pyruvate, ethyl pyruvate, methyl 3-methoxypropionate, ethyl 3-methoxypropionate, γ-butyrolactone, tetrahydrofurfuryl alcohol, N-methyl-2-pyrrolidone, dimethyl formamide, dimethylsulfoxide, 1,4-dioxane, methanol, ethanol, 1-propanol, 2-propanol and butanol.

The composition comprising RMU is prepared by combining the RMU and any other suitable additives. The process described in the above embodiment comprises formulating by mixing appropriate proportions of different components used in said composition until a homogeneous solution is obtained. Said composition may be filtered by microfiltration, ultrafiltration and nanofiltration techniques. Non-limiting examples of appropriate filter media include PTFE, nylon, polypropylene, surface treated polyethylene or polypropylene, etc. The nominal pore size can range from about 0.001 to about 5 micron.

The substrate comprises individually or in combination at least one element from the group consisting of Si, O, N, Al, Cu, C, Ga, Ge, As, Zn and W. Non-limiting examples of suitable substrates used include silicon, silicon oxide, silicon nitride, silicon oxynitride, gallium arsenide, silicon carbide, aluminum, aluminum oxide, aluminum nitride, copper, tungsten, glass, fiber reinforced glass, ITO coated glass, quartz, indium tin oxide and titanium nitride. The substrate can be polished, rough, pre-patterned, coated with conducting ink or doped. The substrate may have more than one layer, for example, an organic or cross-linked organic film, silicon-containing layer or an inorganic hard mask may be deposited on the surface of the substrate before depositing the film comprising the composition comprising RMU.

The composition comprising RMU is deposited on substrate using any one of conventional methods. Non-limiting examples of coating methods are spin coating, spray coating, dip coating, knife or blade coating, slot-die coating, lamination and dry film lamination. Said composition can be deposited in the form of a film or an article of a three-dimensional object. Typical thickness of the film comprising RMU is from about 10 nm to about a few millimeters.

Drying the composition comprising RMU will form a uniform defect-free coating or film. An example of a drying step is heating the substrate at a temperature in the range of about 40° C. to 200° C. for about a few seconds to a few minutes. Non-limiting examples of film thickness ranges for film comprising RMU are between 1 nm and about 1 mm, or between 5 nm and about 500 microns, or between 10 nm and about 200 microns.

Pattern in film comprising RMU can be formed by exposing the film comprising RMU to a source of radiation via a mask, a reticle or a mold. The exposure may also be done by direct writing. Upon exposure portion of the film comprising RMU exposed to radiation becomes insoluble in developer. The unexposed portion of said composition is removed with a suitable developer.

After exposure, film comprising RMU may additionally be subjected to a step or multiple steps of baking at temperatures below 1400° C. or exposure to source of plasma or ion beam. For example, the exposed film comprising RMU can be baked at a temperature below 200° C. before development, then after development can be heated to a temperature of 350° C.

An example of actinic radiation is light (broadband or specific wavelength from about 0.01 nm to about 600 nm) and heat. Non-limiting examples of sources of radiation can be selected individually or in combination from broadband light of wavelength higher than 300 nm, g-line at wavelength of about 405 nm, i-line at wavelength of about 365 nm, deep ultra-violet light at wavelengths of 248 nm and 193 nm, electron-beam, X-ray beam or extreme ultraviolet light.

Total exposure time varies depending on intensity of the radiation, thickness and nature of the film comprising RMU. Exposure time may vary depending on power of radiation. Exposure time may vary from 1 millisecond to about 30 minutes, or about 1 millisecond to about 15 minutes, or 1 second to about 5 minutes. The film comprising RMU may be exposed to radiation whether it is in a solvent-containing state or in a solvent-free state after evaporating the solvent fraction.

The developer may be applied to the substrate by spraying, dipping or puddling. The total contact time with the developer can vary from a few seconds to a few minutes. The time needed to dissolve unexposed regions of the composition would depend on the type of non-aqueous solvent or aqueous solution. Non-limiting examples of solvents used as developer include non-aqueous solvents such as ethers, esters, ketones and alcohols. Non-limiting examples of non-aqueous solvents may be selected individually or in combination from 2-butanone, 3-methyl-2-butanone, 4-methyl-2-pentanone, 4-hydroxy-4-methyl-2-pentanone, 2-heptanone, cyclopentanone, cyclohexanone, 1-methoxy-2-propanol, 2-methoxyethanol, 2-ethoxyethanol, 4-methyl-2-pentanol, ethylene glycol monoisopropyl ether, 2-propoxyethanol, 2-butoxyethanol, 2-ethoxyethyl ether, 2-butoxyethyl ether, diethylene glycol monoethyl ether, diethylene glycol monomethyl ether, diethylene glycol dimethyl ether, 1-methoxy-2-propyl acetate, 2-ethoxyethyl acetate, 1,2-dimethoxy ethane ethyl acetate, cellosolve acetate, methyl lactate, ethyl lactate, n-butyl acetate, methyl pyruvate, ethyl pyruvate, methyl 3-methoxypropionate, ethyl 3-methoxypropionate, γ-butyrolactone, dimethyl sulfoxide, dimethyl formamide, tetraethylene glycol, tetrahydrofurfuryl alcohol, N-methyl-2-pyrrolidone, 1,4-dioxane, methanol, ethanol, 1-propanol, 2-propanol and butanol.

Non-limiting examples of aqueous developers include solutions of tetramethyl ammonium hydroxide, potassium hydroxide, sodium carbonate, and hydrochloric acid in water.

Alternatively, patterns in film comprising RMU can be generated directly by ablation using a source of laser light at wavelengths below 450 nm. In such case absorbance of said composition needs to be sufficient to directly absorb at operating wavelength of the light. The absorbance required depends on parameters such as wavelength and fluence.

Non-limiting examples of etching used to transfer patterns are dry etching and wet etching. Etching may take place in single or multiple steps.

Dry etching can be physical removal of material by plasma, a chemical removal of material by gases, or a combination of physical and chemical removal called reactive ion etching (RIE). Dry etching may include one or more gases, one or more reactive ions, one or more plasmas, or a combination thereof, which are sufficient to etch or remove material of the underlying substrate at an etch rate faster than the refined metal-containing three-dimensional layer. Non-limiting examples of reagents used in dry etching are selected individually or in combination from oxygen, nitrogen, ammonia, hydrofluoric acid, and halogenated gases such as $CHF_3$ (trifluoromethane), $CF_4$ (tetrafluoromethane), $C_4F_8$ (octafluorocyclobutane), $Cl_2$ (chlorine), $SF_6$ (sulfur hexafluoride) and $BCl_3$ (boron trichloride). Dry etching involves gases in plasma as well as inductively coupled plasma (ICP) conditions.

Wet etching involves contact with liquids that selectively remove material or substrate. Non-limiting examples of reagents used in wet etching process include alkalis, mineral or organic acids, and organic solvents. Such reagents can be used individually or in combination. For example, alkalis or mineral acids may be diluted with organic solvents such as dimethyl sulfoxide, n-methyl pyrollidone, tetrahydrofurfuryl alcohol and such. The reagents may be heated or at room temperature.

Type of etching employed, type of reagents used and number of etch steps employed depends on nature of layer and composition of substrate involved.

One description of the process is illustrated schematically in FIG. 1. With reference to FIG. 1, a substrate 100 comprising individually or in combination at least one element from the group consisting of Si, O, N, Al, Cu, C, Ga, Ge, As, Zn and W. A composition comprising RMU is applied in the form of a film to the substrate and is heated to remove any residual solvent or volatiles. After exposure to a light source through a mask, reticle or mold, a developer is used to remove unexposed portion of the film comprising RMU resulting in a patterned film comprising RMU 101. The pattern is transferred to the underlying substrate 100 by dry etch or wet etch techniques. A patterned substrate 102 is obtained. Any remaining RMU comprising film can be removed by any of etching techniques.

Figure 2:
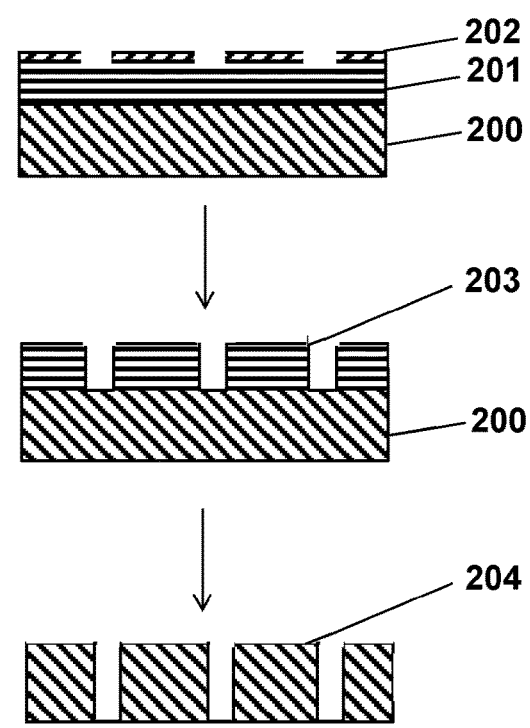
FIG. 2 is a schematic diagram illustrating a process for pattern transfer of a patterned film comprising RMU through an organic layer into a substrate.

One description of this process is illustrated schematically in FIG. 2. With reference to FIG. 2, a substrate 200 comprising individually or in combination at least one element from the group consisting of Si, O, N, Al, Cu, C, Ga, Ge, As, Zn and W. An organic layer 201 is applied to the substrate in the form of a film. The film of the organic layer is rendered insoluble in organic solvent or aqueous developer by subjecting it to heat or light. A composition comprising RMU is deposited in the form of a film on top of the organic layer. The film comprising RMU is heated to remove any residual solvent or volatiles. After exposure to a light source through a mask, reticle or mold, a developer is used to remove unexposed portion of the film comprising of RMU resulting in a patterned film comprising RMU 202. The pattern from the film comprising RMU 202 is further transferred to the underlying organic layer 201 by dry etch or wet etch techniques. A patterned organic layer 203 is obtained. Any remaining film comprising RMU can be removed by any of the etching techniques. The pattern from the patterned organic layer 203 is further transferred to the underlying substrate 200 by dry etch or wet etch techniques. A patterned substrate 204 is obtained. Any remaining organic layer is removed by any of etching techniques.

The organic layer 201 is any film-forming composition. Criteria for selecting such organic layer is based on its relative etch selectivity with film comprising RMU and underlying substrate. The organic layer can also serve other purposes such as controlling reflection of light from the underlying substrate and providing conformal or planarizing coatings to cover any contours present in underlying substrate. The film thickness of the organic layer is between about 5 nm to about 500 micron. A non-limiting example of the organic layer is a film comprising of cross-linked polyhydroxystyrene.

Alternatively, patterns in film comprising RMU can be generated by a process comprising 1) providing a photoresist, 2) depositing said photoresist on the film comprising RMU, 3) drying said photoresist at a temperature below 200° C., 4) forming a pattern in said photoresist film and 5) transferring said pattern to the film comprising RMU by means of etching.

The film comprising RMU is rendered insoluble in organic solvent or aqueous developer by subjecting said film to heat or light prior to step 1.

The photoresist provided can be positive tone or negative tone. The photoresist depends on type of radiation source. Non-limiting examples of photoresist include novolak, polyhydroxystyrene, acrylic, PMMA, epoxy, cyclic olefin, fluoropolymer, silsesquioxane, polybenzoxazole and polyimide based platforms. The photoresist can be deposited on film comprising RMU using any one of conventional methods. Non-limiting examples of coating methods are spin coating, spray coating, dip coating, knife or blade coating, slot-die coating, lamination and dry film lamination.

In embodiments, drying the photoresist is used to drive off any organic solvent or other volatile materials to form a uniform defect-free film. An example of drying the photoresist is heating the substrate at a temperature in the range of about 40° C. to 200° C. for a few seconds to a few minutes. Typical film thickness of photoresist is between about 5 nm to about 500 micron.

Pattern in the photoresist film can be formed by exposing the photoresist film to a source of radiation via a mask, a reticle or a mold. The exposure may also be done by direct writing. In the case of positive tone photoresist, the exposed portion of the photoresist film is removed by developer. In the case of negative tone photoresist, the unexposed portion of the photoresist film is removed by developer. Non-limiting examples of developer are organic solvent and aqueous solutions of tetramethylammonium hydroxide.

Pattern from the photoresist film is transferred to the film comprising RMU by etching. Non-limiting examples of etching used to transfer patterns are dry etching and wet etching described above. Etching may take place in single or multiple steps.

One description of this process is illustrated schematically in FIG. 3. With reference to FIG. 3, a substrate 300 comprising individually or in combination at least one element from the group consisting of Si, O, N, Al, Cu, C, Ga, Ge, As, Zn and W. A composition comprising RMU is applied in the form of a film 301 to the underlying substrate. The film comprising RMU is either heated or exposed to a source of light so that said film is rendered insoluble in organic solvent or aqueous developer. A photoresist film 302 is applied on top of film comprising RMU. After heating to remove any residual solvent or volatiles, the said photoresist film is exposed to a light source through a mask, reticle or mold. A developer is used to remove either exposed portion of the photoresist film (positive tone) or unexposed portion of the photoresist film (negative tone) resulting in a patterned photoresist film 303. The pattern from the photoresist film 303 is transferred to the film comprising RMU 301 by dry etch or wet etch techniques. A patterned film comprising RMU 304 is obtained. Any residual photoresist layer may be removed by any of the etching techniques. The pattern from patterned film comprising RMU 304 is further transferred to the underlying substrate 300 by dry etch or wet etch techniques. The patterned substrate 305 is obtained. Any remaining film comprising RMU can be removed by any of the etching techniques.

One description of this process is illustrated schematically in FIG. 4. With reference to FIG. 4, a substrate 400 comprising individually or in combination at least one element from the group consisting of Si, O, N, Al, Cu, C, Ga, Ge, As, Zn and W. An organic underlayer 401 is applied to the substrate. The organic layer is rendered insoluble in organic solvent or aqueous developer by subjecting it to a step of heating or exposure to a source of light. A composition comprising RMU 402 is applied in the form of a film to the underlying substrate. The film comprising RMU 402 is rendered insoluble in organic solvent or aqueous developer by subjecting it to heating or exposure to a source of light. A photoresist film 403 is applied to the underlying film comprising RMU. The photoresist film is heated to remove residual solvent or volatiles. Said photoresist film is exposed to a light source through a mask, reticle or mold. A developer is used to remove either exposed portion of the film (positive tone) or unexposed portion of the film (negative tone) resulting in a patterned photoresist film 404. The pattern from the patterned photoresist film 404 is transferred to the underlying film comprising RMU 402 by dry etch or wet etch techniques. A patterned film comprising RMU 405 is obtained. Any remaining photoresist film may be removed by any of the etching techniques. In the subsequent step, pattern from patterned film comprising RMU 405 is further transferred to the underlying organic layer 401 by etching. The patterned organic layer 406 is obtained. Any remaining film comprising RMU 405 may be removed by any of the etching techniques. Next, pattern from the patterned organic layer 406 transferred to the substrate 400 by dry etch or wet etch techniques. A patterned substrate 407 is obtained. Any residual organic layer may be removed by any of the etching techniques.

In another embodiment is provided a process for forming a doped patterned substrate. The process comprises a) providing a RMU, b) preparing a composition comprising RMU c) providing a substrate, d) depositing said composition on substrate e) drying said composition at a temperature below 200° C., f) forming a pattern in the film comprising RMU, and g) depositing dopants into the exposed portion of the substrate using a reactive ion beam.

The RMU, composition comprising RMU and substrate are as described above. Depositing and drying steps are as described above. Pattern in the film comprising RMU can be formed by any of the processes described above.

Ion implantation introduces dopant to the exposed underlying substrate by reactive ion beam. Non-limiting examples of dopants employed are ions of phosphorus, boron, arsenic, antimony, aluminum, gallium, and indium. A non-limiting example of underlying substrate is silicon carbide.

The doped substrate with patterned film comprising RMU may further be baked or annealed before or after removing the said patterned film. Typical baking temperatures are about 200° C. to about 1400° C.

The remaining film comprising RMU may be removed by dry or wet etching. For example, a solution of 5% hydrofluoric acid can be used to remove the remaining film comprising RMU.

No dopant is present on substrate underneath the patterned portion of film comprising RMU.

Figure 5:
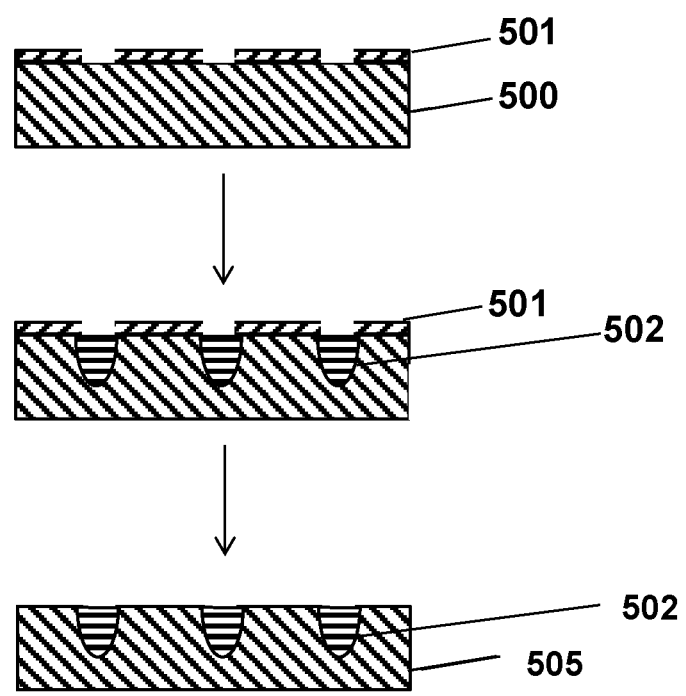
FIG. 5 is a schematic diagram illustrating ion implantation into a patterned substrate formed by pattern transfer from patterned film comprising RMU.

One description of this process is illustrated schematically in FIG. 5. With reference to FIG. 5, a substrate 500 is provided comprising individually or in combination at least one element from the group consisting of Si, O, N, Al, Cu, C, Ga, Ge, As, Zn and W. A composition comprising RMU is applied in the form of a film to the substrate. The film comprising RMU is heated to remove any residual solvent or volatiles. After exposure to a light source through a mask, reticle or mold, a developer is used to remove unexposed portion of the film comprising RMU to generate a patterned film comprising RMU 501. Reactive ion beam deposits dopants into regions of substrate 500 uncovered by patterned film comprising RMU 501 at sufficient energy to penetrate the substrate forming doped regions 502 of the substrate. A doped substrate 505 is obtained. The remaining portion of the film comprising RMU can be removed by any of the etching techniques.

EXAMPLES

The following examples demonstrate reduction of yield impurities in the refined metal-containing compounds.
Yield Impurity Analysis: A 2 g sample of RMU solid or solution was analyzed by
ICP-MS or GFAA for levels of metals at ppb levels.

Comparative Example 1

Yield impurity analysis of zirconium carboxyethyl acrylate (60 wt % in propanol) contained 2,060,000 ppb or 0.2% sodium, 27,000 ppb potassium, 847,000 ppb aluminum, 2,600 ppb iron and 2,800 ppb zinc.

Example 1

A solution of zirconium acrylate (50 g, 20 wt % in methanol) was added dropwise to a stirring solution of deionized water adjusted to pH 4 with acrylic acid (500 mL) in a 1-L polypropylene beaker. Zirconium acrylate precipitate was isolated by vacuum filtration using a polypropylene Buchner funnel with 11 micron filter paper on a 1-L filter flask under vacuum (400 mbar). The precipitate was dried in a vacuum oven at 70° C. for 2 hours at 10 mbar.

In this example, the process reduces yield impurities to 1,100 ppb sodium and 700 ppb iron in zirconium acrylate.

Example 2

A solution of hafnium carboxyethyl acrylate (20 g, 60 wt % in 1-butanol) was filtered through a 1.0 micron PTFE syringe filter then added dropwise to a stirring solution of deionized water adjusted to pH 4 with 2-carboxyethyl acrylate (200 mL) in a 600-mL polypropylene beaker. Hafnium carboxyethyl acrylate precipitate was isolated by allowing the precipitate to settle followed by decanting the aqueous liquid. The precipitate was dissolved in 1-methoxy-2-propanol (40 wt %) and was distilled at 60° C. under vacuum to 10 mbar until solution was 60 wt %.

In this example, the process reduces yield impurities to 50% of original sodium content, 65% of original iron content and 40% of original copper content in hafnium carboxyethyl acrylate.

Example 3

A solution of zirconium carboxyethyl acrylate (200 g, 60 wt % in 1-propanol) was filtered through an 8.0 micron filter paper then added dropwise to a stirring solution of deionized water adjusted to pH 4 with 2-carboxyethyl acrylate (2000 mL) in a 4-L polypropylene beaker. Zirconium carboxyethyl acrylate precipitate was isolated by allowing the precipitate to settle followed by decanting the liquid portion containing acidified deionized water. The precipitate was dried in a vacuum oven at 60° C. for 2 hours at 10 mbar.

In this example, the process reduces yield impurities to 900 ppb sodium, 750 ppb iron, and 170 ppb copper in zirconium carboxyethyl acrylate.

Example 4

A solution of zirconium carboxyethyl acrylate (100 g, 60 wt % in 1-butanol) was dissolved in 1-butanol (300 g). Deionized water adjusted to pH 4 with 2-carboxyethyl acrylate (100 g) was added and the mixture was stirred for 20 minutes. After the two phases separated, aqueous phase was removed (75 g). The organic phase was distilled at 60° C. under vacuum to 10 mbar until solution was 60 wt % in 1-butanol. The zirconium carboxyethyl acrylate solution was filtered through a 1.0 micron PTFE membrane filter.

In this example, the process reduces yield impurities to 85% of original sodium content and 60% of original iron content in zirconium carboxyethyl acrylate.

Example 5

A solution of hafnium carboxyethyl acrylate (100 g, 60 wt % in 1-butanol) was dissolved in 1-butanol and ethyl acetate (300 g). Deionized water adjusted to pH 4 with 2-carboxyethyl acrylate (100 g) was added and the mixture was stirred for 20 minutes. After the two phases separated, aqueous phase was removed (75 g). The organic phase was distilled at 40-60° C. under vacuum to 10 mbar until solution was 60 wt % in 1-butanol.

In this example, the process reduces yield impurities to 1,200 ppb of sodium, 960 ppb potassium, 4,800 ppb copper, 1,200 ppb calcium, 1,680 ppb iron, 120 ppb zinc and no detectable amount of chromium, magnesium or manganese in hafnium carboxyethyl acrylate.

Example 6

The refined zirconium carboxyethyl acrylate described in Example 4 was dissolved in a solvent combination of 1-methoxy-2-propanol and 1-methoxy-2-propyl acetate. Photoinitiators were added to the solution (1-hydroxy-cyclohexyl-phenyl-ketone, Irgacure 184 from Ciba Specialty Chemicals and bis(2,4,6-trimethylbenzoyl)-phenylphosphineoxide, Irgacure 819 from Ciba Specialty Chemicals). The resulting mixture was homogeneous after stirring. The homogeneous solution was filtered through a 0.1 micron PTFE syringe filter.

A 100-mm silicon wafer with a silicon oxide layer at 380 nm thickness on the polished side was the substrate. The composition comprising refined zirconium carboxyethyl acrylate was spin-coated onto the silicon oxide layer. The composition comprising refined zirconium carboxyethyl acrylate was dried at 100° C. for 60 seconds and film thickness was measured at 200 nm. The film comprising refined zirconium carboxyethyl acrylate was exposed through a contact photomask on a Karl Suss MJB3 broadband mask aligner. The unexposed regions of the film comprising refined zirconium carboxyethyl acrylate were developed with 1-methoxy-2-propanol.

In this example, the refined zirconium carboxyethyl acrylate was provided and prepared into a composition by mixing with initiator. The composition comprising refined zirconium carboxyethyl acrylate was deposited to form a film on a silicon oxide coated silicon wafer, the film dried at temperature below 200° C. and exposed to a source of light through a mask. The patterned film comprising refined zirconium carboxyethyl acrylate was developed with an organic solvent developer. A pattern resolution of 5 micron was produced.

Example 7

A portion of the wafer containing the patterned film comprising refined zirconium carboxyethyl acrylate described in Example 6 was etched with a combination of $C_4F_8$ and $O_2$ reactive ion etch (RIE) gases to remove the exposed underlying silicon oxide layer. The etch rate of the refined zirconium carboxyethyl acrylate film was 0.58 nm/s and the etch rate of the exposed underlying silicon oxide layer was 2.58 nm/s.

In this example, a patterned silicon oxide substrate was formed by transferring the pattern in the film comprising refined zirconium carboxyethyl acrylate in Example 6 by dry etching.

Example 8

Another portion of the wafer containing the patterned film comprising refined zirconium carboxyethyl acrylate described in Example 6 was baked at 250° C. for 5 minutes before was plasma etched with a combination of $C_4F_8$ and $O_2$ RIE gases to remove the exposed underlying silicon oxide layer. The etch rate of the film comprising refined zirconium carboxyethyl acrylate was 0.00 nm/s and the etch rate of the exposed underlying silicon oxide was 2.58 nm/s.

In this example, a patterned silicon oxide substrate was formed by first heating the patterned film comprising refined zirconium carboxyethyl acrylate of Example 6 followed by transferring the pattern by dry etching. The etch rate of the film comprising refined zirconium carboxyethyl acrylate was further reduced.

Example 9

The refined zirconium carboxyethyl acrylate described in Example 4 was dissolved in a solvent combination of 1-methoxy-2-propanol and 1-methoxy-2-propyl acetate. Photoinitiator was added to the solution (bis(2,4,6-trimethylbenzoyl)-phenylphosphineoxide, Irgacure 819 from Ciba Specialty Chemicals). The resulting mixture was homogeneous after stirring. The homogeneous solution was filtered through a 0.2 micron PTFE syringe filter. The composition comprising refined zirconium carboxyethyl acrylate was spin-coated onto a 50-mm silicon wafer substrate. The composition comprising refined zirconium carboxyethyl acrylate was dried at 90° C. for 120 seconds and film thickness was measured at 150 nm. The film comprising refined zirconium carboxyethyl acrylate was exposed with a Raith e-beam writer 10 keV tool at exposure dose 0.22 pC. The unexposed regions of film comprising refined zirconium carboxyethyl acrylate were developed with 1-methoxy-2-propanol.

In this example, the refined zirconium carboxyethyl acrylate was provided and prepared into a composition by mixing with initiator. The composition comprising refined zirconium carboxyethyl acrylate was deposited to form a film on a silicon wafer, the film dried at temperature below 200° C. and exposed to a source of direct writing e-beam. The patterned film comprising refined zirconium carboxyethyl acrylate was developed with an organic solvent developer. A pattern resolution of 250 nm was formed by direct writing.

Example 10

The refined zirconium carboxyethyl acrylate described in Example 4 was dissolved in a solvent combination of 1-methoxy-2-propanol and 1-methoxy-2-propyl acetate. The resulting mixture was homogeneous after stirring. The homogeneous solution was filtered through a 0.2 micron PTFE syringe filter. The composition comprising refined zirconium carboxyethyl acrylate was spin-coated onto a 50-mm silicon wafer substrate. The composition comprising refined zirconium carboxyethyl acrylate was dried at 90° C. for 120 seconds and film thickness was measured at 150 nm. The film comprising refined zirconium carboxyethyl acrylate was exposed with a Raith e-beam writer 10 keV tool at exposure dose 0.22 pC. The unexposed regions of the film comprising refined zirconium carboxyethyl acrylate were developed with 1-methoxy-2-propanol.

In this example, the refined zirconium carboxyethyl acrylate was provided and prepared into a composition without an initiator. The composition comprising refined zirconium carboxyethyl acrylate was deposited to form a film on a silicon wafer, the film dried at temperature below 200° C. and exposed to a source of direct writing e-beam. The patterned film comprising refined zirconium carboxyethyl acrylate was developed with an organic solvent developer. A pattern resolution of 250 nm was formed by direct writing.

Example 11

The refined zirconium carboxyethyl acrylate described in Example 4 was dissolved in a solvent combination of 1-methoxy-2-propanol and 1-methoxy-2-propyl acetate. Photoinitiator were added to the solution (2,4,6-trimethylbenzoyl-diphenylphosphineoxide, Lucerin TPO from BASF). The resulting mixture was homogeneous after stirring. The homogeneous solution was filtered through a 1.0 micron PTFE syringe filter.

The composition comprising refined zirconium carboxyethyl acrylate was spin-coated onto a 100-mm silicon wafer substrate. The composition comprising refined zirconium carboxyethyl acrylate was dried at 100° C. for 60 seconds and film thickness was measured at 100 nm. The film comprising refined zirconium carboxyethyl acrylate was exposed with a 405 nm direct writing laser filtered to 10%.

The unexposed regions of the film comprising refined zirconium carboxyethyl acrylate were developed with 1-methoxy-2-propanol.

In this example, the refined zirconium carboxyethyl acrylate was provided and prepared into a composition by mixing with initiator. The composition comprising refined zirconium carboxyethyl acrylate was deposited to form a film on a silicon wafer, the film dried at temperature below 200° C. and exposed to a source of direct writing light. The patterned film comprising refined zirconium carboxyethyl acrylate was developed with an organic solvent developer. A pattern resolution of 600 nm was formed by direct writing.

Example 12

The refined zirconium carboxyethyl acrylate described in Example 4 was dissolved in a solvent combination of 1-methoxy-2-propanol and 1-methoxy-2-propyl acetate. Photoinitiators were added to the solution (1-hydroxy-cyclohexyl-phenyl-ketone, Irgacure 184 from Ciba Specialty Chemicals and bis(2,4,6-trimethylbenzoyl)-phenylphosphineoxide, Irgacure 819 from Ciba Specialty Chemicals). The resulting mixture was homogeneous after stirring. The homogeneous solution was filtered through a 0.2 micron PTFE syringe filter.

A 100-mm silicon wafer was the substrate. The composition comprising refined zirconium carboxyethyl acrylate was spin-coated onto the substrate. The composition comprising refined zirconium carboxyethyl acrylate was dried at 110° C. for 60 seconds and film thickness was measured at 500 nm. A laser at wavelength 308 nm with fluence of 250 mJ/cm2 and frequency of 100 Hz was used in a mirror scan machining method.

In this example, the refined zirconium carboxyethyl acrylate was provided and prepared into a composition by mixing with initiator. The composition comprising refined zirconium carboxyethyl acrylate was deposited to form a film on a silicon wafer, the film dried at temperature below 200° C. and exposed to a source of heat. The film comprising refined zirconium carboxyethyl acrylate was then patterned by laser ablation using a mask resulting in a pattern resolution of 5 micron.

Example 13

The refined zirconium carboxyethyl acrylate described in Example 4 was dissolved in a solvent combination of 1-methoxy-2-propanol, n-propanol and 1-methoxy-2-propyl acetate. Thermal initiator was added to the solution (benzoyl peroxide from Sigma-Aldrich). The resulting mixture was homogeneous after stirring. The homogeneous solution was filtered through a 0.1 micron PTFE syringe filter.

A 300-mm silicon wafer with a silicon oxide layer at 200 nm thickness on the polished side was the substrate. A bottom antireflective coating similar to coating described in Reichmanis, E. and Thompson, L. F. "Polymer materials for microlithography" Chem. Rev. Vol. 89, 1989, pp. 1273-1289 was spin-coated, dried and crosslinked on the silicon oxide side as organic layer and film thickness was measured at 130 nm. The composition comprising refined zirconium carboxyethyl acrylate was spin-coated on top of the organic layer. The film comprising refined zirconium carboxyethyl acrylate was dried at 120° C. then baked at 225° C. for a film thickness of 30 nm. Dielectric constant of film comprising RMU was measured at 1 MHz by mercury probe. The dielectric constant measured 11.76 (series) and 11.75 (parallel). A negative-tone immersion photoresist sensitive to 193 nm light similar to photoresist described in Sanders, D. P. "Advances in patterning materials for 193 nm immersion lithography" Chem. Rev., Vol. 110, 2010, pp. 312-360 was spin-coated on top of the film comprising refined zirconium carboxyethyl acrylate. The photoresist was dried into a film at a 75 nm thickness and exposed at 193 nm immersion conditions before developing the unexposed region with n-butyl acetate.

In this example, the refined zirconium carboxyethyl acrylate was provided and prepared into a composition by mixing with initiator. The composition comprising refined zirconium carboxyethyl acrylate was deposited to form a film on an organic layer covered silicon wafer, the film dried at temperature below 200° C. and exposed to a source of heat at temperature below 1400° C. A photoresist was provided and deposited on the film comprising refined zirconium carboxyethyl acrylate. The photoresist was exposed to a source of light and was developed with an aqueous developer. A pattern resolution of 50 nm was produced.

Example 14

The exposed underlying film comprising refined zirconium carboxyethyl acrylate described in Example 13 was etched with a combination of $CHF_3$ and $O_2$ RIE gases (45 sccm and 5 sccm respectively, 40 mTorr, 150 W). The etch rate of the exposed underlying film comprising refined zirconium carboxyethyl acrylate was 0.17 nm/s and the etch rate of the patterned photoresist film was 0.00 nm/s.

The exposed underlying organic layer was etched with $O_2$ RIE gas (10 sccm, 10 mTorr, 50 W). The etch rate of the exposed underlying organic layer was 0.70 nm/s, the etch rate of the patterned photoresist film was 0.75 nm/s, and the etch rate of exposed film comprising refined zirconium carboxyethyl acrylate was 0.03 nm/s.

The exposed underlying silicon oxide layer was etched with a combination of $C_4F_8$ and $O_2$ RIE gases (45 sccm and 5 sccm respectively, 10 mTorr, 29 W with ICP 3500 W). The etch rate of the exposed underlying silicon oxide layer was 2.58 nm/s. The etch rate of the patterned film comprising RMU was 0.58 nm/s. Etching with $O_2$ RIE gas removes any trace amounts of organic layer.

In this example, a patterned organic layer on top of substrate was formed by transferring the pattern in the photoresist in Example 13 into the film comprising refined zirconium carboxyethyl acrylate by dry etching followed by transferring the pattern into the organic layer by dry etching. The pattern was transferred into the silicon oxide layer of the substrate by dry etching.

Example 15

The refined zirconium carboxyethyl acrylate described in Example 3 was dissolved in a solvent combination of 1-methoxy-2-propanol, n-propanol and 1-methoxy-2-propyl acetate. Photoinitiators were added to the solution (1-hydroxy-cyclohexyl-phenyl-ketone, Irgacure 184 from Ciba Specialty Chemicals and bis(2,4,6-trimethylbenzoyl)-phenylphosphineoxide, Irgacure 819 from Ciba Specialty Chemicals). The resulting mixture was homogeneous after stirring. The homogeneous solution was filtered through a 0.2 micron PTFE syringe filter.

The composition comprising refined zirconium carboxyethyl acrylate was spin-coated onto a 100-mm quartz wafer substrate. The composition comprising RMU was dried at 110° C. and film thickness was measured at 440 nm. The film comprising refined zirconium carboxyethyl acrylate exposed through a contact photomask on a Karl Suss MJB3 mask aligner. The unexposed regions of the film comprising refined zirconium carboxyethyl acrylate were developed with 1-methoxy-2-propanol.

In this example, the refined zirconium carboxyethyl acrylate was provided and prepared into a composition by mixing with initiator. The composition comprising refined zirconium carboxyethyl acrylate was deposited to form a film on quartz wafer, the film dried at temperature below 200° C. and exposed to a source of light through a mask. The patterned film comprising RMU was developed with 1-methoxy-2-propanol. A pattern resolution of 1 inch was produced.

Example 16

The exposed underlying quartz wafer and the patterned film comprising refined zirconium carboxyethyl acrylate described in Example 15 were implanted with $5.00 \times 10^{15}$ $^{31}P+$ ions/cm$^2$ at 190 keV, 150 µA. The patterned film comprising refined zirconium carboxyethyl acrylate did not crack or disappear during implantation indicating no damage caused by penetration of doping ion. The patterned film comprising refined zirconium carboxyethyl acrylate was removed by mineral acid. The area of the quartz wafer previously covered by the patterned film comprising refined zirconium carboxyethyl acrylate was analyzed by EDX probe and no phosphorus was detected indicating no dopant penetrated the quartz wafer.

In this example, a doped patterned quartz wafer was formed by depositing dopants through the pattern in the film comprising RMU in Example 15 by ion implantation.

Example 17

The refined zirconium carboxyethyl acrylate described in Example 3 was dissolved in a solvent combination of 1-methoxy-2-propanol, n-propanol and 1-methoxy-2-propyl acetate. Photoinitiators were added to the solution (1-hydroxy-cyclohexyl-phenyl-ketone, Irgacure 184 from Ciba Specialty Chemicals and bis(2,4,6-trimethylbenzoyl)-phenylphosphineoxide, Irgacure 819 from Ciba Specialty Chemicals). The resulting mixture was homogeneous after stirring. The homogeneous solution was filtered through a 1.0 micron PTFE syringe filter.

The composition comprising refined zirconium carboxyethyl acrylate was spin-coated onto a 100-mm silicon wafer substrate. The composition comprising refined zirconium carboxyethyl acrylate was dried at 110° C. and film thickness was measured at 690 nm. The film comprising refined zirconium carboxyethyl acrylate was exposed through a contact photomask on a Karl Suss MJB3 mask aligner. The unexposed regions of the film comprising refined zirconium carboxyethyl acrylate were developed with 1-methoxy-2-propanol.

In this example, the refined zirconium carboxyethyl acrylate was provided and prepared into a composition by mixing with initiator. The composition comprising refined zirconium carboxyethyl acrylate was deposited to form a film on a silicon wafer substrate, the film dried at temperature below 200° C. and exposed to a source of light through a mask. The patterned film comprising refined zirconium carboxyethyl acrylate was developed with 1-methoxy-2-propanol. A pattern resolution of 1 inch was produced.

Example 18

The patterned film comprising refined zirconium carboxyethyl acrylate described in Example 17 was baked at 250° C. for 20 minutes. The exposed underlying silicon wafer and the patterned film comprising refined zirconium carboxyethyl acrylate were implanted with $5.00 \times 10^{15}$ $^{31}P+$ ions/cm$^2$ at 190 keV, 150 µA. The patterned film comprising refined zirconium carboxyethyl acrylate did not crack or disappear during implantation indicating no penetration of dopant in area of silicon wafer previously covered by film comprising refined zirconium carboxyethyl acrylate. The sample was then baked at 400° C. for 10 minutes and the patterned film comprising refined zirconium carboxyethyl acrylate was removed from the patterned doped silicon wafer with buffered oxide etch solution.

In this example, a doped patterned silicon wafer was formed by depositing $^{31}P^+$ ions through the pattern in the film comprising refined zirconium carboxyethyl acrylate in Example 17 by ion implantation. The residual film comprising refined zirconium carboxyethyl acrylate was removed by wet etching. The substrate was not doped in the area previously covered by the film comprising refined zirconium carboxyethyl acrylate.

Example 19

The refined zirconium carboxyethyl acrylate described in Example 3 was dissolved in a solvent combination of 1-methoxy-2-propanol, n-propanol and 1-methoxy-2-propyl acetate. Photoinitiators were added to the solution (1-hydroxy-cyclohexyl-phenyl-ketone, Irgacure 184 from Ciba Specialty Chemicals and bis(2,4,6-trimethylbenzoyl)-phenylphosphineoxide, Irgacure 819 from Ciba Specialty Chemicals). The resulting mixture was homogeneous after stirring. The homogeneous solution was filtered through a 1.0 micron PTFE syringe filter.

The composition comprising refined zirconium carboxyethyl acrylate was spin-coated onto a 100-mm silicon wafer substrate. The composition comprising refined zirconium carboxyethyl acrylate was dried at 110° C. and film thickness was measured at 580 nm. The film comprising refined zirconium carboxyethyl acrylate was exposed through a contact photomask on a Karl Suss MJB3 mask aligner. The unexposed regions of the film comprising refined zirconium carboxyethyl acrylate were developed with 1-methoxy-2-propanol.

In this example, the refined zirconium carboxyethyl acrylate was provided and prepared into a composition by mixing with initiator. The composition comprising refined zirconium carboxyethyl acrylate was deposited to form a film on a silicon wafer, the film dried at temperature below 200° C. and exposed to a source of light through a mask. The patterned film comprising RMU was developed with 1-methoxy-2-propanol. A pattern resolution of 1 inch was produced.

Example 20

The patterned film comprising refined zirconium carboxyethyl acrylate described in Example 19 was baked at 600° C. for 5 minutes. The exposed underlying silicon wafer and the patterned film comprising refined zirconium carboxyethyl acrylate were implanted with $5.00 \times 10^{16}$ $^{27}Al+$ ions/cm$^2$ at 150 keV, 250 µA on a heated stage at 650° C. The patterned film comprising refined zirconium carboxyethyl acrylate did not crack or disappear during implantation indicating no penetration of dopant in area of silicon wafer previously covered by film comprising refined zirconium carboxyethyl acrylate.

In this example, a doped patterned silicon wafer was formed by depositing dopants through the pattern in the film comprising refined zirconium carboxyethyl acrylate in Example 19 by ion implantation. The residual film comprising refined zirconium carboxyethyl acrylate was removed by wet etching. The substrate was not doped in the area previously covered by the film comprising refined zirconium carboxyethyl acrylate.

Example 21

The refined zirconium carboxyethyl acrylate described in Example 3 was mixed with acryl-terminated POSS (43 weight % of refined zirconium carboxyethyl acrylate) then dissolved in a solvent combination of 1-methoxy-2-propanol, n-propanol and 1-methoxy-2-propyl acetate. Photoinitiators were added to the solution (1-hydroxy-cyclohexylphenyl-ketone, Irgacure 184 from Ciba Specialty Chemicals and bis(2,4,6-trimethylbenzoyl)-phenylphosphineoxide, Irgacure 819 from Ciba Specialty Chemicals). The resulting mixture was homogeneous after stirring. The homogeneous solution was filtered through a 0.2 micron PTFE syringe filter.

The composition comprising refined zirconium carboxyethyl acrylate was spin-coated onto a 100-mm quartz wafer substrate. The composition comprising RMU was dried at 110° C. and film thickness was measured at 710 nm. The film comprising refined zirconium carboxyethyl acrylate exposed through a contact photomask on a Karl Suss MJB3 mask aligner. The unexposed regions of the film comprising refined zirconium carboxyethyl acrylate were developed with 1-methoxy-2-propanol.

In this example, the refined zirconium carboxyethyl acrylate was provided and prepared into a composition by mixing with initiator. The composition comprising refined zirconium carboxyethyl acrylate was deposited to form a film on quartz wafer, the film dried at temperature below 200° C. and exposed to a source of light through a mask. The patterned film comprising RMU was developed with 1-methoxy-2-propanol. A pattern resolution of 1 inch was produced.

Example 22

The exposed underlying substrate and the patterned film comprising refined zirconium carboxyethyl acrylate and acryl-terminated POSS described in Example 21 was baked at 250° C. for 20 minutes. The exposed underlying silicon wafer and the patterned film comprising refined zirconium carboxyethyl acrylated and acryl-terminated POSS were implanted with $5.00 \times 10^{15}$ $^{31}$P+ ions/cm² at 190 keV, 150 μA. The patterned film comprising refined zirconium carboxyethyl acrylate and acryl-terminated POSS did not crack or disappear during implantation indicating no damage caused by penetration of dopant in area of silicon wafer previously covered by film comprising refined zirconium carboxyethyl acrylate and acryl-terminated POSS.

In this example, a doped patterned silicon wafer was formed by depositing dopants through the pattern in the film comprising RMU and PU in Example 21 by ion implantation.

Variations of the above-disclosed products, processes and systems may be desirably combined into other systems. Additionally, currently unforeseen or unanticipated alternatives, modifications and improvements may be subsequently made by those skilled in the art which are also encompassed by the claims.

What is claimed is:

1. A process comprising:
    a. providing a metal-containing unit (MU) where MU is represented by Structure I:

$$MA_wB_xC_y \qquad \text{Structure I}$$

where M comprises a metal with a formal valency of 0-7 and is selected from Zr, Hf and Ti; Ligand A contains a reactive functional group capable of undergoing a combining reaction; w is 0 to 7; Ligands B and C are selected individually or in combination from oxygen, nitrogen, sulfur, or a halogen atom; hydroxyl, peroxo, phosphate, borate, tungstate, sulfate, silicate; substituted or unsubstituted linear, branched or cyclic alkyl, alkyl ether, alkyl ester, thioalkyl, alkenyl or alkynyl group; substituted or unsubstituted aryl group; and —XR¹ where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and R¹ represents a hydrogen atom, substituted or unsubstituted linear, branched or cyclic alkyl or thioalkyl group, a heterocyclic group, an alicyclic group, and a substituted or unsubstituted aryl or heteroaryl group; x and y are 0 to 7, and w+x+y is 2-7; and dissolving the MU in an organic solvent, the MU being present in the range of about 5 weight percent to about 70 weight percent based on the total weight of the MU and the organic solvent, to form an MU solution,
    b. providing an acidified solution of deionized water at a pH of 2-6.5 by adding an acid to deionized water, the acid being represented by the structure R²—COOH, wherein R² is selected individually or in combination from substituted or unsubstituted linear, branched or cyclic alkyl, alkenyl or alkynyl group, alkyl ester, alkenyl ester, alkenyl ether or alkyl ether; substituted or unsubstituted aryl group,
    c. mixing the MU solution with the acidified solution of deionized water,
    d. isolating a refined metal-containing unit (RMU),
    e. providing a substrate,
    f. depositing the isolated RMU to form a film on the substrate,
    g. drying the film comprising RMU at a temperature less than 200° C.,
    h. forming a pattern in the film comprising RMU wherein the pattern is produced by pattern transfer from a patterned photoresist film by means of etching, and
    i. transferring a pattern to the substrate.

2. The process of claim 1 wherein the MU is dissolved in a water miscible organic solvent and during step (d) the RMU is isolated as a precipitate.

3. The process of claim 1, wherein the MU is dissolved in a water immiscible organic solvent, and during step (d) the RMU is isolated as a solution by separating the MU solution from the acidified solution of deionized water in distinct layers, and discarding the layer containing the acidified solution of deionized water.

4. The process of claim 1 wherein, in (i), the pattern is transferred to the substrate by means of etching.

5. The process of claim 1, further comprising, after step (e):
    j. forming an organic layer on the substrate before depositing the isolated RMU.

6. The process of claim 5 wherein the pattern is transferred from the film comprising RMU to the organic layer by means of etching, and the pattern is transferred from the organic layer to the substrate.

7. A process comprising:
a. providing a metal-containing unit (MU) where MU is represented by Structure I:

$MA_wB_xC_y$  Structure I where M comprises a metal with a formal valency of 0-7 and is selected from Zr, Hf, and Ti; Ligand A contains a reactive functional group capable of undergoing a combining reaction; w is 0 to 7; Ligands B and C are selected individually or in combination from oxygen, nitrogen, sulfur, or a halogen atom; hydroxyl, peroxo, phosphate, borate, tungstate, sulfate, silicate; substituted or unsubstituted linear, branched or cyclic alkyl, alkyl ether, alkyl ester, thioalkyl, alkenyl or alkynyl group; substituted or unsubstituted aryl group; and —XR1 where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and R1 represents a hydrogen atom, substituted or unsubstituted linear, branched or cyclic alkyl or thioalkyl group, a heterocyclic group, an alicyclic group, and a substituted or unsubstituted aryl or heteroaryl group; x and y are 0 to 7, and w+x+y is 2-7; and dissolving the MU in an organic solvent, the MU being present in the range of about 5 weight percent to about 70 weight percent based on the total weight of the MU and the organic solvent, to form an MU solution,
b. providing an acidified solution of deionized water at a pH of 2-6.5 by adding an acid to deionized water, the acid being represented by the structure R2—COOH, wherein R2 is selected individually or in combination from substituted or unsubstituted linear, branched or cyclic alkyl, alkenyl or alkynyl group, alkyl ester, alkenyl ester, alkenyl ether or alkyl ether; substituted or unsubstituted aryl group,
c. mixing the MU solution with the acidified solution of deionized water,
d. isolating a refined metal-containing unit (RMU),
e. providing a substrate,
f. forming an organic layer on the substrate,
g. depositing the isolated RMU on the organic layer to form a film on the substrate,
h. drying the film comprising RMU at a temperature less than 200° C.,
i. forming a pattern in the film comprising RMU, and
j. transferring a pattern to the substrate.

8. The process of claim 7 wherein the MU is dissolved in a water miscible organic solvent and during step (d) the RMU is isolated as a precipitate.

9. The process of claim 7, wherein the MU is dissolved in a water immiscible organic solvent, and during step (d) the RMU is isolated as a solution by separating the MU solution from the acidified solution of deionized water in distinct layers, and discarding the layer containing the acidified solution of deionized water.

10. The process of claim 7 wherein the pattern is transferred from the film comprising RMU to the organic layer by means of etching, and the pattern is transferred from the organic layer to the substrate.

11. The process of claim 10 wherein the pattern is transferred from the organic layer to the substrate by means of etching.

12. A process comprising:
a. providing a metal-containing unit (MU) where MU is represented by Structure I:

$MA_wB_xC_y$  Structure I where M comprises a metal with a formal valency of 0-7 and is selected from Zr, Hf and Ti; Ligand A contains a reactive functional group capable of undergoing a combining reaction; w is 0 to 7; Ligands B and C are selected individually or in combination from oxygen, nitrogen, sulfur, or a halogen atom; hydroxyl, peroxo, phosphate, borate, tungstate, sulfate, silicate; substituted or unsubstituted linear, branched or cyclic alkyl, alkyl ether, alkyl ester, thioalkyl, alkenyl or alkynyl group; substituted or unsubstituted aryl group; and —$XR^1$ where X represents an organic functional group such as oxy, thio, carboxy, thiocarboxy, sulfo, oxalate, acetoacetonate, carbanion, carbonyl, thiocarbonyl, cyano, nitro, nitrito, nitrate, nitrosyl, azide, cyanato, isocyanato, thiocyanato, isothiocyanato, amido, amine, diamine, arsine, diarsine, phosphine, and diphosphine, and $R^1$ represents a hydrogen atom, substituted or unsubstituted linear, branched or cyclic alkyl or thioalkyl group, a heterocyclic group, an alicyclic group, and a substituted or unsubstituted aryl or heteroaryl group; x and y are 0 to 7, and w+x+y is 2-7; and dissolving the MU in an organic solvent, the MU being present in the range of about 5 weight percent to about 70 weight percent based on the total weight of the MU and the organic solvent, to form an MU solution,
b. providing an acidified solution of deionized water at a pH of 2-6.5 by
adding an acid to deionized water, the acid being represented by the structure $R^2$—COOH, wherein $R^2$ is selected individually or in combination from substituted or unsubstituted linear, branched or cyclic alkyl, alkenyl or alkynyl group, alkyl ester, alkenyl ester, alkenyl ether or alkyl ether; substituted or unsubstituted aryl group,
c. mixing the MU solution with the acidified solution of deionized water,
d. isolating a refined metal-containing unit (RMU),
e. providing a substrate,
f. depositing the isolated RMU to form a film on the substrate,
g. drying the film comprising RMU at a temperature less than 200° C.,
h. forming a pattern in the film comprising RMU,
i. transferring a pattern to the substrate,
wherein the substrate is doped via the patterned film comprising RMU by a process comprising:
j. depositing dopants on the substrate using a reactive ion beam, and
k. removing the patterned film comprising RMU.

13. The process of claim 12 wherein the MU is dissolved in a water miscible organic solvent and during step (d) the RMU is isolated as a precipitate.

14. The process of claim 12, wherein the MU is dissolved in a water immiscible organic solvent, and during step (d) the RMU is isolated as a solution by separating the MU solution from the acidified solution of deionized water in distinct layers, and discarding the layer containing the acidified solution of deionized water.

15. The process of claim 12, further comprising, after step (e): forming an organic layer on the substrate before depositing the isolated RMU.

* * * * *